United States Patent [19]

Lawrence

[11] Patent Number: 5,105,340
[45] Date of Patent: Apr. 14, 1992

[54] CIRCUIT BOARD

[75] Inventor: Howard Lawrence, Southampton, England

[73] Assignee: BICC Public Limited Company, London, England

[21] Appl. No.: 603,213

[22] Filed: Oct. 25, 1990

[30] Foreign Application Priority Data

Oct. 27, 1989 [GB] United Kingdom ............... 8924229

[51] Int. Cl.⁵ .............................................. H05K 1/11
[52] U.S. Cl. ................................... 361/414; 361/400; 361/407; 361/415; 174/255; 439/65; 338/260
[58] Field of Search ............. 361/400, 407, 414, 415; 338/260, 320; 174/255, 257; 439/65, 59, 76

[56] References Cited

U.S. PATENT DOCUMENTS

| 3,835,442 | 9/1974 | Anderson et al. | 174/257 X |
| 3,971,610 | 7/1976 | Buchoff et al. | 174/257 X |
| 4,054,939 | 10/1977 | Ammon | 361/414 |
| 4,449,769 | 5/1984 | Kobayashi et al. | 361/414 X |
| 4,626,804 | 12/1986 | Risher et al. | 338/260 X |
| 4,694,123 | 9/1987 | Massey | 361/414 X |

Primary Examiner—Leo P. Picard
Assistant Examiner—Paramita Ghosh
Attorney, Agent, or Firm—Oliff & Berridge

[57] ABSTRACT

In a "Futurebus+" backplane, at each end of the backplane the signal lines are each electrically connected to a power bus spaced from the rear face of the backplane via a discrete resistor which is housed in a throughbore in a body of electrically insulating material detachably secured to the rear face of the bakplane and which is electrically connected between the power bus and a pin soldered in a plated through hole and interconnected in the signal line. The ground lines are each connected to the power bus via a discrete capacitor which is housed in a throughbore in the body and which is electrically connected between the power bus and a pin soldered in a plated through hole and interconnected in the ground line. In the event that a resistor or capacitor should be faulty, only the signal or ground line to which the faulty resistor or capacitor is connected will be out of service until the faulty resistor or capacitor is replaced.

19 Claims, 3 Drawing Sheets

CIRCUIT BOARD

In complex electronic apparatus incorporating a plurality of circuit boards arranged with their major faces lying in substantially parallel planes, it is the general practice to interconnect circuits of such boards by means of multi-circuits and associated connectors carried on a board, frequently referred to as a mother board or backplane, to which edge connectors of said plurality of circuit boards are permanently or detachably connected.

One kind of mother board or backplane which has hitherto been proposed and used comprises a substantially rigid board of electrically insulating material having extending through the board a multiplicity of holes whose boundary walls are coated with a layer of electrically conductive metal or metal alloy (such metal coated holes generally and hereinafter being referred to as plated through holes) and which are arranged in a plurality of discrete groups of plated through holes mutually spaced transversely of the board, the plated through holes of each group being arranged in a pattern of columns and rows of mutually spaced holes, the pitch between adjacent plated through holes of each column and of each row being n. Each of a major proportion of the plated through holes of each group is electrically connected in series to the correspondingly positioned plated through hole in each of the other groups by an elongate track of electrically conductive metal or metal alloy encapsulated in the electrically insulating material of the rigid board to form a signal line, the tracks electrically connected to the plated through holes of corresponding columns of the groups lying in common planes which are substantially parallel to and mutually spaced from one another and being electrically insulated from one another by the electrically insulating material of the board. Each of the remaining minor proportion of the plated through holes of each group is electrically connected to a substantially continuous layer of electrically conductive metal or metal alloy which is encapsulated in the electrically insulating material of the board and which constitutes a ground plane, to form a ground line. A mother board or backplane of the aforesaid kind will hereinafter, for convenience, be referred to as "a backplane of the kind described". A backplane of the kind described may carry also a power bus or a number of power buses; the or a power bus may be an area of electrically conductive metal or metal alloy on a major surface of the rigid board and/or the or a power bus may be a substantially continuous layer of electrically conductive metal or metal alloy constituting a power plane encapsulated in the electrically insulating material of the board and spaced and electrically insulated from the or each ground plane or from an adjacent power plane.

When a backplane of the kind described is to be used, at each end of the backplane the signal lines are electrically connected to a power bus remote from the backplane or to the or a power bus or power plane constituting a component part of the backplane through resistors and the ground lines are electrically connected to said power bus or power plane through capacitors.

In one backplane of the kind described which is currently widely used and which is generally known as the "Futurebus" backplane, each group of plated through holes comprises three columns each of 32 mutually spaced holes, the pitch n between adjacent holes in each column and in each row being 2.54 mm. At each end of a "Futurebus" backplane, each signal line is terminated by a terminator assembly which carries a multi-socket connector for engaging with pins which have been electrically connected in the plated through holes of the end group of holes and which protrude from the rear of the board. A major proportion of the signal line sockets of the multi-socket connector carried by each terminator assembly are electrically connected via resistor packs mounted on the terminator assembly to the or a power bus remote from the board and the remaining minor proportion of ground line sockets—which are substantially evenly distributed in the multi-socket connector—are electrically connected to this power bus via capacitor packs mounted on the terminator assembly; each resistor pack is electrically connected to a plurality of signal lines, usually nine, and each capacitor pack is electrically connected to a plurality of ground lines. usually between ten and fourteen. Whilst the "Futurebus" backplane and the terminator assemblies used with the "Futurebus" backplane have been found to be suitable for accommodating the bit rate of the digital signals transmitted by electronic apparatus currently in use, it has been found that they cannot accommodate the high bit rate of the digital signals transmitted by the more complex electronic apparatus now employed, with the result that the transmitted digital signals are inevitably delayed, attenuated or distorted. Moreover, it has been found that the sockets of the multi-socket connectors of the terminator assemblies used with the "Futurebus" backplane are so arranged relative to one another that, when the transmitted digital signals have a high bit rate, there is invariably unacceptable interference, i.e. cross talk, between transmitted digital signals carried by separate signal lines of the board.

With a view to providing a backplane of the kind described which will have greater flexibility and enhanced performance, a backplane of the kind described has been proposed—known as the "Futurebus+" backplane—in which each group of plated through holes to which an edge connector of a circuit board can be electrically connected consists of four columns of 48 holes, the pitch n between adjacent holes in each column and in each row being 2 mm. For the first time, at each end of each group additional plated through holes are provided for reception of a separate power connector. A signal connector to be connected to the 192 plated through holes of each group may comprise discrete modules of, say, 4×6 pins which can be assembled end to end to form a 192 pin connector which will be connected to the front face of the board and with which a female edge connector of a circuit board can readily engage. Alternatively, the signal connector may comprise a single module of 4×48 pins. The pins of each module assembled to form the pin connector protrude a very short distance from the rear face of the board and may be soldered in place. As a consequence, the terminator assemblies currently employed to terminate a "Futurebus" backplane are not suitable for terminating the Futurebus+ backplane and a terminating arrangement for terminating a "Futurebus+" backplane is required which in no way will inhibit use being made of the greater flexibility and enhanced performance of the "Futurebus+" backplane.

It is an object of the present invention to provide a backplane of the kind described, which incorporates an improved arrangement for terminating the signal and ground lines of the backplane.

In the improved backplane of the kind described according to the invention, at each end of the backplane the signal lines are each electrically connected to a power bus separately formed with respect to and spaced from the rear face of the backplane via a discrete resistor which is housed at least in part in a throughbore in a body of electrically insulating material detachably secured to the rear face of the backplane and which is electrically connected in series between the plated through hole in the group of holes at said end of the backplane interconnected in said signal line and said separately formed power bus and the ground lines are each connected to said power bus via a discrete capacitor which is housed at least in part in a throughbore in said body and which is electrically connected in series between the plated through hole in said group of holes interconnected in said ground line and said separately formed power bus.

By virtue of the fact that each signal line at each of its ends is connected to a discrete resistor and each ground line at each of its ends is connected to a discrete capacitor, in the event that a resistor or capacitor should be faulty only the signal or ground line to which the faulty resistor or capacitor is connected will be out of service until the faulty resistor or capacitor is replaced. This is an important advantage not provided by the terminator assemblies of the "Futurebus" backplane.

Preferably, the body of electrically insulating material detachably secured to the rear face of the backplane has a plurality of throughbores whose axes are substantially parallel to one another and which are arranged in a pattern of columns and rows with the pitch between adjacent throughbores of each column and of each row corresponding to the pitch between adjacent plated through holes of each column and of each row of the group of holes at said end of the backplane. The body may also have two or more throughbores for accommodating screws or other fastening means to be employed to secure the body to the rear face of the backplane.

The separately formed power bus may comprise a layer of electrically conductive metal or metal alloy on a surface of a sheet or board of electrically insulating material or it may comprise a self-supporting sheet of electrically conductive metal or metal alloy. Alternatively, the separately formed power bus may be of non-metallic material and comprise either a layer of electrically conductive rubber or resilient plastics material on a surface of a sheet or board of electrically insulating material or a self-supporting sheet of electrically conductive rubber or resilient plastics material.

Any convenient method may be employed to electrically connect one terminal of each discrete resistor or discrete capacitor to its associated plated through hole of said group of holes of the backplane and to electrically connect the other terminal of the resistor or capacitor to the separately formed power bus and the particular methods used may be those most suitable for use with the forms of separately formed power buses and discrete resistors or discrete capacitors employed. Where, as is preferred, each discrete resistor and each discrete capacitor has at each of its ends a terminal cap, preferably one terminal cap of each resistor or capacitor is urged into abutting relationship with the end face of an electrically conductive pin soldered or a press fit in the associated plated through hole of said group of holes and protruding a short distance from the rear face of the backplane either by one of a plurality of resilient leaves which have been punched or otherwise formed from a self-supporting sheet of electrically conductive metal or metal alloy constituting the separately formed power bus and which are arranged in a pattern of columns and rows with the pitch between adjacent leaves of each column and of each row corresponding to the pitch between adjacent throughbores in the electrically insulating body and to the pitch between adjacent plated through holes in said group of holes in the backplane, or by one of a plurality of pips or pads which are integral with and upstand from one surface of a layer or self-supporting sheet of electrically conductive rubber or resilient plastics material constituting the separately formed power bus and which are arranged in a pattern of columns and rows with the pitch between adjacent pips or pads of each column and of each row corresponding to the pitch between adjacent throughbores in the electrically insulating body and to the pitch between adjacent plated through holes in said group of holes in the backplane. It will be appreciated that, in this arrangement, any faulty resistor or capacitor can be readily replaced by temporarily disconnecting the body from the rear face of the backplane, replacing the faulty resistor or capacitor by a sound resistor or capacitor and re-securing the body to the rear face of the backplane. Where each discrete resistor or discrete capacitor has a terminal lead at each of its ends, one terminal lead of each resistor or capacitor may be soldered in the associated plated through hole of said group of holes in the backplane and the other terminal lead may be soldered to a layer or self-supporting sheet of electrically conductive metal or metal alloy constituting the separately formed power bus.

Preferably, each resistor and capacitor is housed wholly in one of the throughbores in the body of electrically insulating material but, in some circumstances, each plated through hole of said group of holes at each end of the backplane may be stepped intermediate of its length and over a part of its length nearer the rear face of the backplane may be of such a diameter that it will accommodate a part of the length of a discrete resistor or discrete capacitor. In this case, a terminal cap of the resistor or capacitor may be soldered directly into the plated through hole or to a pad of metal or metal alloy secured in and electrically connected to the plated through hole intermediate of its ends.

Where the separately formed power bus comprises a board of electrically insulating material having on one of its faces a layer of electrically conductive metal or metal alloy, the metal layer may be on the face of the board remote from the insulating body and the board may have extending through the board a multiplicity of holes arranged in a pattern of columns and rows of mutually spaced holes, the pitch between adjacent holes of each column and of each row corresponding to the pitch between adjacent throughbores in the electrically insulating body and each hole being of such a diameter that it will accommodate a part of the length of a discrete resistor or discrete capacitor.

The improved backplane terminating arrangement of the present invention is especially, but not exclusively, suitable for use with a "Futurebus+" backplane and, in this case, the bus will use recently developed, high-current open collector Backplane Transceiver Logic (BTL) on all signals.

The invention also includes, for use with a backplane of the kind described, a terminator assembly comprising a body of electrically insulating material having extending between opposed substantially flat faces of the body a plurality of throughbores arranged in a pattern of columns and rows of mutually spaced throughbores, each throughbore being of such a cross-sectional size that it will house a discrete resistor or capacitor and, detachably secured to one of said opposed flat faces of the body, a separately formed power bus. The separately formed power bus may comprise a board or sheet of electrically insulating material having on one of its faces a layer of electrically conductive metal or metal alloy or a self-supporting sheet of electrically conductive metal or metal alloy; alternatively, the separately formed power bus may be of non-metallic material and comprise either a layer of electrically conductive rubber or resilient plastics material on a surface of a sheet or board of electrically insulating material or a self-supporting sheet of electrically conductive rubber or resilient plastics material.

The terminator assembly may also include any one or more of the optional features of the improved terminating arrangement hereinbefore described.

The invention is further illustrated by a description, by way of example, of four preferred terminator assemblies for use with a backplane of the kind described and of four arrangements for terminating the signal and ground lines of a backplane of the kind described with reference to the accompanying drawings, in which.

Figure 2:
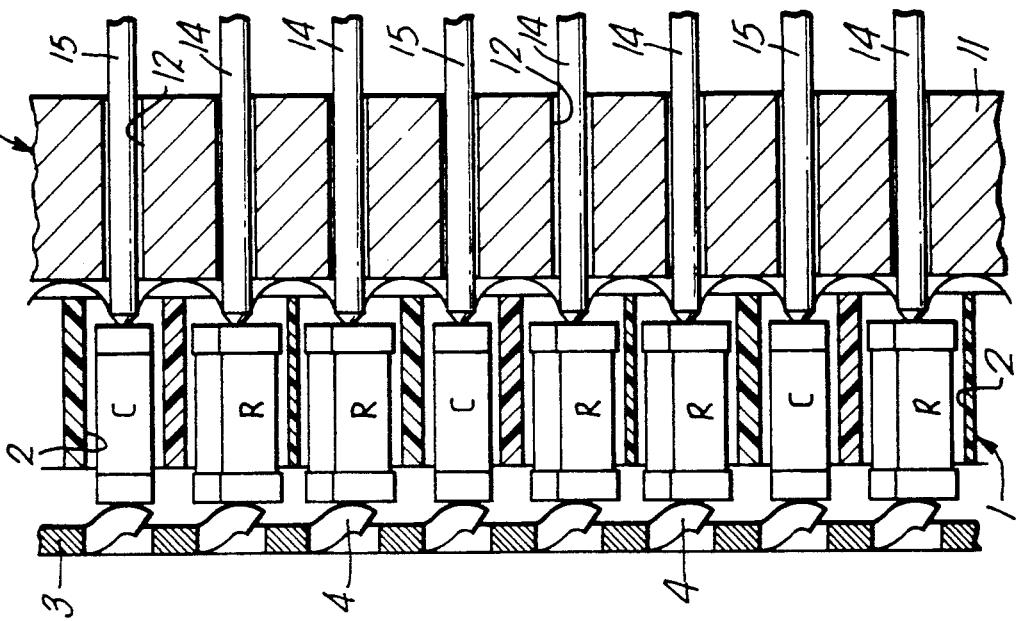
FIG. 2 is a fragmental sectional side view of the first preferred backplane terminating arrangement using the first preferred terminator assembly shown in FIG. 1.
Figure 1:
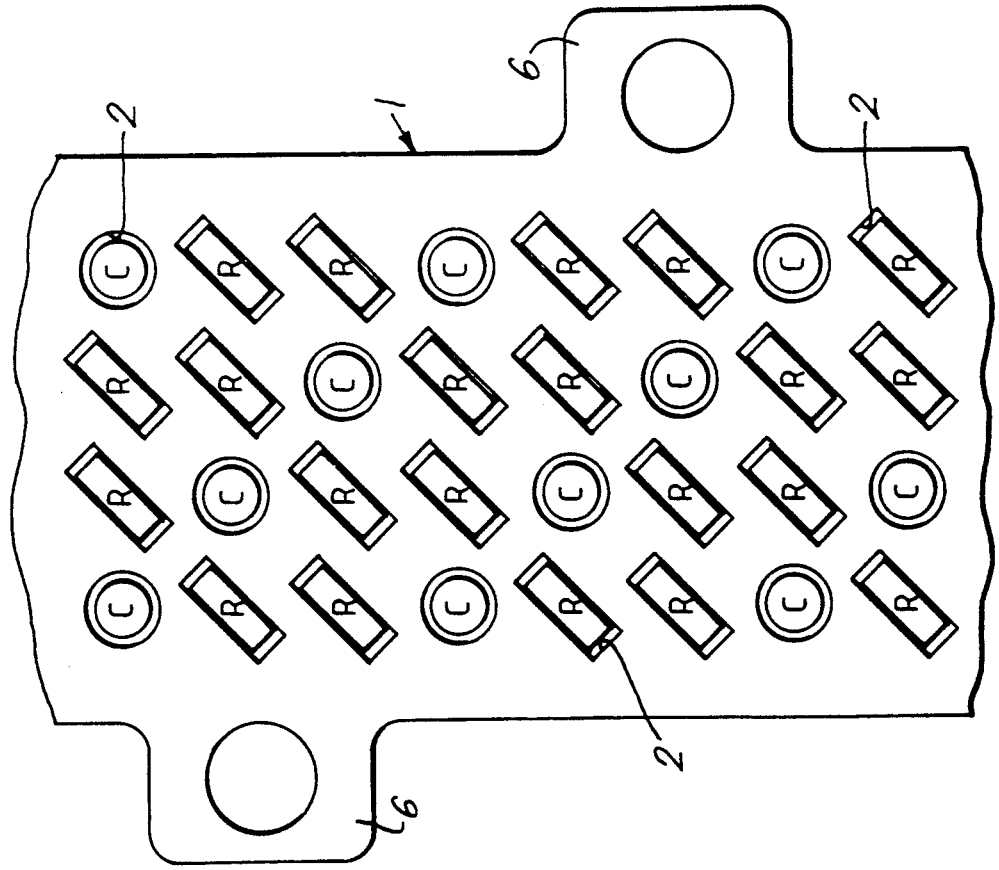
FIG. 1 is a fragmental diagrammatic plan view of the insulating body of the first preferred terminator assembly with discrete resistors and discrete capacitors housed in the throughbores of the electrically insulating body of the terminator assembly.

Referring to FIGS. 1 and 2, the first preferred backplane terminator assembly comprises a body 1 of electrically insulating material having extending between opposed flat faces of the body a plurality of throughbores 2 arranged in a pattern of columns and rows of mutually spaced throughbores, each throughbore being of such a cross-sectional size that it will house a discrete resistor R or a discrete capacitor C. Detachably secured by any convenient means (not shown) to one of the opposed flat faces of the electrically insulating body 1 is a self-supporting sheet 3 of electrically conductive metal or metal alloy constituting a separately formed power bus. The separately formed metal sheet 3 has a plurality of resilient leaves 4 which have been punched from the sheet and which are arranged in a pattern of columns and rows with the pitch between adjacent leaves of each column and of each row corresponding to the pitch between adjacent throughbores 2 in the electrically insulating body 1. The pitch between adjacent throughbores 2 in each column and in each row in the electrically insulating body 1 itself corresponds to the pitch between adjacent plated through holes of each column and of each row of the group of holes at an end of a backplane of the kind described.

The backplane 10 of the kind described to be terminated by the first preferred terminator assembly is of conventional construction and comprises a rigid board 11 of electrically insulating material having extending through the board a multiplicity of plated through holes arranged in a plurality of discrete groups mutually spaced transversely of the board, the plated through holes of each group being arranged in a pattern of columns and rows of mutually spaced holes. Each of a major proportion of the plated through holes of each group is electrically connected in series to the correspondingly positioned plated through hole in each of the other groups by an elongate track of electrically conductive metal encapsulated in the electrically insulating material of the board 11 to form a signal line, the tracks electrically connected to the plated through holes of corresponding columns of the groups lying in common planes which are parallel to and mutually spaced from one another and being electrically insulated from one another by the electrically insulating material of the board. Each of the remaining minor proportion of the plated through holes of each group is electrically connected to a continuous layer of electrically conductive metal which is encapsulated in the electrically insulating material of the board 11 and which constitutes a ground plane, to form a ground line. As will be seen on referring to FIG. 2, an electrically conductive pin is soldered in each plated through hole 12 of the group of plated through holes at each end of the electrically insulating rigid board 11 of the backplane 10 (a part of one column only of the group being visible) in such a way that the pin protrudes a short distance from the rear face of the board, pins 14 being soldered in plated through holes electrically connected in a signal line and pins 15 being soldered in plated through holes electrically connected in a ground line. At each end of the backplane 10, the first preferred terminator assembly is detachably secured to the rigid board 11 of the backplane, e.g. by fixing bolts passing through apertured lugs 6 projecting from opposite sides of the insulating body 1, with discrete resistors R having terminal caps in those throughbores 2 that will be in axial alignment with pins 14 electrically connected in signal lines and discrete capacitors C having terminal caps in those throughbores that will be in axial alignment with pins 15 electrically connected in ground lines. Each pin 14 is electrically connected to the self-supporting metal sheet 3 constituting a power bus separately formed with respect to and spaced from the rear face of the backplane 10 via a discrete resistor R, one terminal cap of the resistor being urged into abutting relationship with the end face of the pin by one of the resilient leaves 4 engaging the other terminal cap of the resistor. Likewise, each pin 15 is electrically connected to the self-supporting metal sheet 3 constituting the separately formed power bus via a discrete capacitor C, one terminal cap of the capacitor being urged into abutting relationship with the end face of the pin by one of the resilient leaves 4 engaging the other terminal cap of the capacitor.

Figure 3:
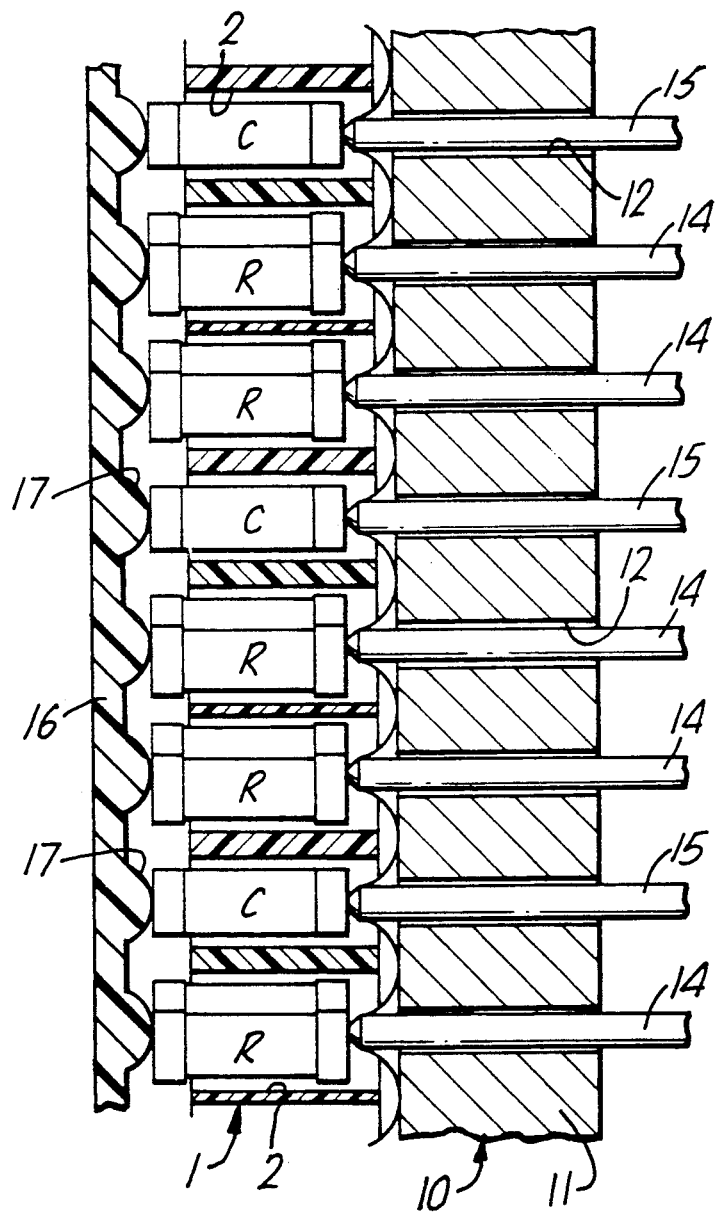
FIG. 3 is a fragmental sectional side view of the second preferred backplane terminating arrangement using the second preferred terminator assembly.

The second preferred backplane terminating arrangement shown in FIG. 3 is identical in all respects to the first preferred backplane terminating arrangement shown in FIG. 2 with the sole exception that the separately formed power bus of the second preferred terminator assembly comprises a self-supporting sheet 16 of electrically conductive rubber having a plurality of pips 17 which are integral with and upstand from one surface of the self-supporting rubber sheet and which are arranged in a pattern of columns and rows with the pitch between adjacent pips of each column and of each row corresponding to the pitch between adjacent throughbores 2 in the electrically insulating body 1 and to the pitch between adjacent plated through holes 12 in the group of holes at the end of the backplane. The upstanding pips 17 serve the same purpose as the resilient leaves 4 of the separately formed power bus 3 of the first preferred terminator assembly in urging terminal caps of the resistors R and capacitors C, respectively, into abutting relationship with the end faces of electrically conductive pins 14 and 15.

Figure 4:
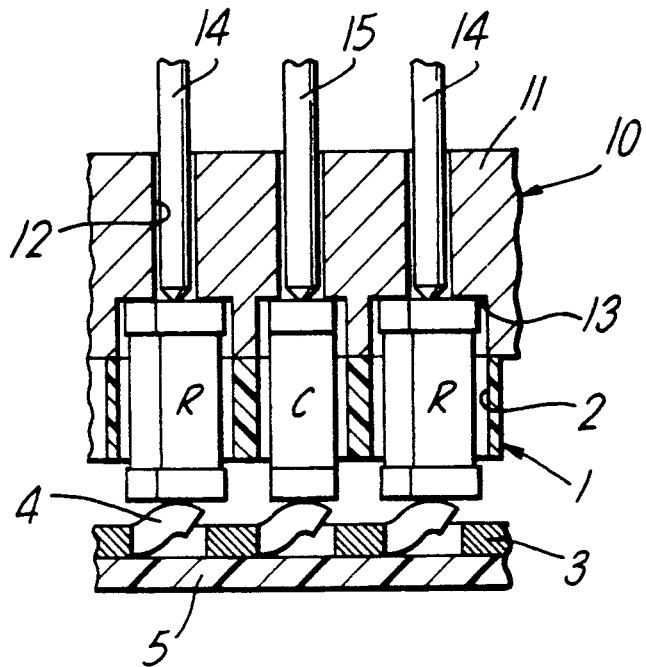
FIG. 4 is a fragmental sectional side view of the third preferred backplane terminating arrangement using the third preferred terminator assembly.

The third preferred backplane terminating arrangement shown in FIG. 4 differs from the first preferred backplane terminating arrangement shown in FIG. 2 in two respects. First, each plated through hole 12 of the group of plated through holes at each end of the electrically insulating rigid board 11 of the backplane 10 is stepped intermediate of its length to form in the hole a shoulder 13 and over a part of its length nearer the rear face of the backplane the hole is of such a diameter that a part of the length of a discrete resistor R or discrete capacitor C is accommodated therein, a terminal cap of the resistor or capacitor being soldered directly in the plated through hole. Secondly, metal sheet 3 constituting the power bus is secured to one face of a board 5 of electrically insulating material.

Figure 5:
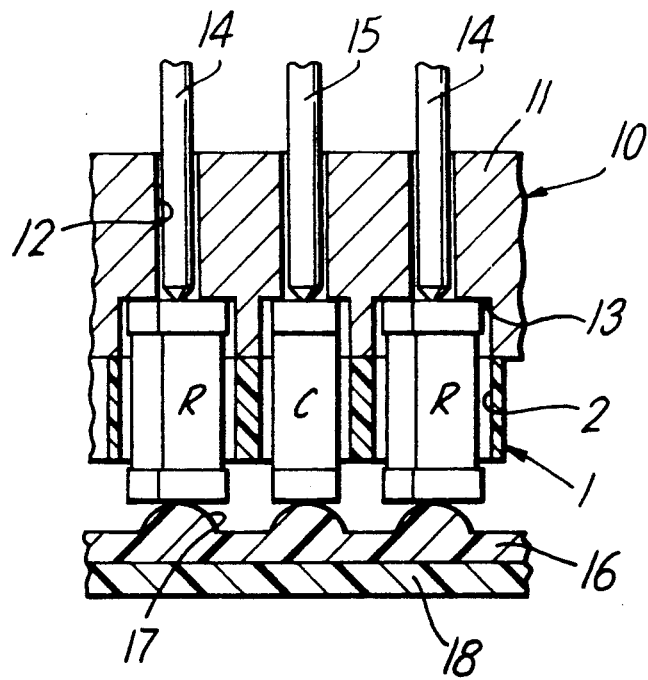
FIG. 5 is a fragmental sectional side view of the fourth preferred backplane terminating arrangement using the fourth preferred terminator assembly.

The fourth preferred backplane terminating arrangement shown in FIG. 5 is identical in all respects to the third preferred backplane terminating arrangement shown in FIG. 4 with the signal exception that the separately formed powerbus of the fourth preferred backplane terminating arrangement comprises a board 18 of electrically insulating material having secured to one of its major surfaces a sheet 16 of electrically conductive rubber having a plurality of pips 17 which are the same as and serve the same purpose as the pips 17 of the separately formed powerbus 16 shown in FIG. 3.

In each of the four preferred backplane terminating arrangements shown in FIGS. 2 to 5, by virtue of the fact that each signal line at each of its ends is connected to a discrete resistor R and each ground line at each of its ends is connected to a discrete capacitor C, in the event that a resistor or capacitor should be faulty only the signal or ground line to which the faulty resistor or capacitor is connected will be out of service until the faulty resistor or capacitor is replaced.

What I claim as my invention is:

1. A backplane of the kind comprising a substantially rigid board of electrically insulating material having extending through the board a multiplicity of plated through holes arranged in a plurality of discrete groups of plated through holes mutually spaced transversely of the board, the plated through holes of each group being arranged in a pattern of columns and rows of mutually spaced holes, each of a major proportion of the plated through holes of each group being electrically connected in series to the correspondingly positioned plated through hole in each of the other groups by an elongate track of electrically conductive metal or metal alloy encapsulated in the electrically insulating material of the rigid board to form a signal line, the tracks electrically connected to the plated through holes of corresponding columns of the groups lying in common planes which are substantially parallel to and mutually spaced from one another and being electrically insulated from one another by the electrically insulating material of the board, and each of the remaining minor proportion of the plated through holes of each group being electrically connected to a substantially continuous layer of electrically conductive metal or metal alloy which is encapsulated in the electrically insulating material of the board and which constitutes a ground plane, to form a ground line; wherein at each end of the backplane the signal lines are each electrically connected to a power bus separately formed with respect to and spaced from the rear face of the backplane via a discrete resistor which is housed at least in part in a throughbore in a body of electrically insulating material detachably secured to the rear face of the backplane and which is electrically connected in series between the plated through hole in the group of holes at said end of the backplane interconnected in said signal line and said separately formed power bus, and the ground lines are each connected to said power bus via a discrete capacitor which is housed at least in part in a throughbore in said body and which is electrically connected in series between the plated through hole in said group of holes interconnected in said ground line and said separately formed power bus.

2. A backplane as claimed in claim 1, wherein the body of electrically insulating material detachably secured to the rear face of the backplane has a plurality of throughbores whose axes are substantially parallel to one another and which are arranged in a pattern of columns and rows with the pitch between adjacent throughbores of each column and of each row corresponding to the pitch between adjacent plated through holes of each column and of each row of the group of holes at said end of the backplane.

3. A backplane as claimed in claim 1, wherein the separately formed power bus comprises a layer of electrically conductive metal or metal alloy on a surface of a board of electrically insulating material.

4. A backplane as claimed in claim 3, wherein the metal layer is on the face of the board remote from the insulating body and the board has extending through the board a multiplicity of holes arranged in a pattern of columns and rows of mutually spaced holes, the pitch between adjacent holes of each column and of each row corresponding to the pitch between adjacent throughbores in the electrically insulating body and each hole being of such a diameter that it will accommodate a part of the length of a discrete resistor or discrete capacitor.

5. A backplane as claimed in claim 1, wherein the separately formed power bus comprises a self-supporting sheet of electrically conductive metal or metal alloy.

6. A backplane as claimed in claim 5, wherein each discrete resistor and each discrete capacitor has at each of its ends a terminal cap and wherein one terminal cap of each resistor or capacitor is urged into abutting relationship with the end face of an electrically conductive pin in electrical contact in the associated plated through hole of said group of holes in and protruding from the rear face of the backplane by one of a plurality of resilient leaves which have been found from the self-supporting sheet of electrically conductive metal or metal alloy constituting the separately formed power bus and which are arranged in a pattern of columns and rows with the pitch between adjacent leaves of each column and of each row corresponding to the pitch between adjacent throughbore in the electrically insulating body and to the pitch between adjacent plated through holes in said group of holes in the backplane.

7. A backplane as claimed in claim 1, wherein the separately formed power bus comprises a layer of electrically conductive resilient non-metallic material on a surface of a board of electrically insulating material.

8. A backplane as claimed in claim 1, wherein the separately formed power bus comprises a self-supporting sheet of electrically conductive resilient non-metallic material.

9. A backplane as claimed in claim 1, wherein the separately formed power bus comprises a sheet of electrically conductive resilient non-metallic material, wherein each discrete resistor and each discrete capacitor has at each of its ends a terminal cap and wherein one terminal cap of each resistor or capacitor is urged into abutting relationship with the end face of an electrically conductive pin in electrical contact in the associated plated through hole of said group of holes and protruding from the rear face of the backplane by one of a plurality of pips which are integral with and upstand from one surface of said of electrically conductive resilient non-metallic material constituting the separately formed power bus and which are arranged in a pattern of columns and rows with the pitch between adjacent pips of each column and of each row corresponding to the pitch between adjacent throughbores in the electrically insulating body and to the pitch between adjacent plated through holes in said group of holes in the backplane.

10. A backplane as claimed in claim 1, wherein the separately formed power bus comprises a sheet of electrically conductive metal or metal alloy, wherein each discrete resistor and each discrete capacitor has a terminal lead at each of its ends and wherein one terminal lead of each resistor or capacitor is soldered in the associated plated through hole of said group of holes in the backplane and the other terminal lead is soldered to said sheet of electrically conductive metal or metal alloy constituting the separately formed busbar.

11. A backplane as claimed in claim 1, wherein each plated through hole of said group of holes at each end of the backplane is stepped intermediate of its length and over a part of its length nearer the rear face of the backplane is of such a diameter that it will accommodate a part of the length of a discrete resistor or discrete capacitor.

12. A backplane terminating arrangement as claimed in claim 11, wherein a terminal of each resistor or capacitor is soldered directly into the plated through hole.

13. For use with a backplane of the kind comprising a substantially rigid board of electrically insulating material having extending through the board a multiplicity of plated through holes arranged in a plurality of discrete groups of plated through holes mutually spaced transversely of the board, the plated through holes of each group being arranged in a pattern of columns and rows of mutually spaced holes, each of a major proportion of the plated through holes of each group being electrically connected in series to the correspondingly positioned plated through hole in each of the other groups by an elongate track of electrically conductive metal or metal alloy encapsulated in the electrically insulating material of the rigid board to form a signal line, the tracks electrically connected to the plated through holes of corresponding columns of the groups lying in common planes which are substantially parallel to and mutually spaced from one another and being electrically insulated from one another by the electrically insulating material of the board, and each of the remaining minor proportion of the plated through holes of each group being electrically connected to a substantially continuous layer of electrically conductive metal or metal alloy which is encapsulated in the electrically insulating material of the board and which constitutes a ground plane, to form a ground line; a terminator assembly comprising a body of electrically insulating material having opposed substantially flat faces and, extending between said faces, a plurality of throughbores arranged in a pattern of columns and rows of mutually spaced throughbores, each throughbore being of such a cross-sectional size that it will house a discrete resistor or discrete capacitor, and, detachably secured to one of said faces of the body, a separately formed power bus.

14. A terminator assembly as claimed in claim 13, wherein the separately formed power bus comprises a board of electrically insulating material having on one of its faces a layer of electrically conductive metal or metal alloy.

15. A terminator assembly as claimed in claim 13, wherein the separately formed power bus comprises a self-supporting sheet of electrically conductive metal or metal alloy.

16. A terminator assembly as claimed in claim 15, wherein the self-supporting sheet of electrically conductive metal or metal alloy constituting the separately formed power bus has a plurality of resilient leaves which have been formed from the sheet and which are arranged in a pattern of columns and rows with the pitch between adjacent leaves of each column and of each row corresponding to the pitch between adjacent throughbores in the electrically insulating body.

17. A terminator assembly as claimed in claim 13, wherein the separately formed power bus comprises a layer of electrically conductive resilient non-metallic material on a surface of a board of electrically insulating material.

18. A terminator assembly as claimed in claim 13, wherein the separately formed power bus comprises a self-supporting sheet of electrically conductive resilient non-metallic material.

19. A terminator assembly as claimed in claim 13, wherein the separately formed power bus comprises a sheet of electrically conductive resilient non-metallic material and wherein said sheet of electrically conductive resilient non-metallic material has a plurality of pips which are integral with and upstand from one surface of said sheet and which are arranged in a pattern of columns and rows with the pitch between adjacent pips of each column and of each row corresponding to the pitch between adjacent throughbores in the electrically insulating body.

* * * * *